United States Patent
Chun et al.

(10) Patent No.: US 7,209,399 B2
(45) Date of Patent: Apr. 24, 2007

(54) CIRCUIT AND METHOD OF DRIVING BITLINES OF INTEGRATED CIRCUIT MEMORY USING IMPROVED PRECHARGE SCHEME AND SENSE-AMPLIFICATION SCHEME

(75) Inventors: Ki-chul Chun, Gyeonggi-do (KR); Chang-ho Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/180,832

(22) Filed: Jul. 13, 2005

(65) Prior Publication Data

US 2006/0023535 A1 Feb. 2, 2006

(30) Foreign Application Priority Data

Jul. 13, 2004 (KR) .................. 10-2004-0054489

(51) Int. Cl.
*G11C 7/00* (2006.01)
(52) U.S. Cl. ............... 365/205; 365/149; 365/203; 365/210
(58) Field of Classification Search ............ 365/149, 365/203, 205, 210
See application file for complete search history.

(56) References Cited

U.S. PATENT DOCUMENTS 6,052,324 A * 4/2000 Tobita .................. 365/207
6,594,187 B2 * 7/2003 Ito .......................... 365/203
6,797,997 B2 * 9/2004 Hata ....................... 257/201

FOREIGN PATENT DOCUMENTS

| JP | 2002-157885 | 5/2002 |
|---|---|---|
| KR | 100167673 B1 | 9/1998 |
| KR | 1020030056465 A | 7/2003 |
| KR | 1020040003210 A | 1/2004 |

* cited by examiner

*Primary Examiner*—Hoai V. Ho
(74) *Attorney, Agent, or Firm*—Myers Bigel Sibley & Sajovec PA

(57) ABSTRACT

Provided are a bitline driving circuit of an integrated circuit memory that enhances a precharge scheme and a sense amplification scheme and a bitline driving method. In the bitline driving circuit, a new scheme of precharging the bitlines to voltages greater than or smaller than a voltage VCCA/2 using an auxiliary circuit is used to increase a gate-source voltage of transistors included in each sense amplification circuit. Also, when cell data is 1 and 0, a dummy cell can maintain a voltage difference between the bitlines BL and BLB generated after charge sharing. Furthermore, a sense amplification circuit, which is controlled by an offset control circuit, can remove a threshold voltage offset between the transistors included in each sense amplification circuit. At this time, an auxiliary circuit is used to stabilize the voltage difference.

23 Claims, 11 Drawing Sheets

CIRCUIT AND METHOD OF DRIVING BITLINES OF INTEGRATED CIRCUIT MEMORY USING IMPROVED PRECHARGE SCHEME AND SENSE-AMPLIFICATION SCHEME

REFERENCE TO PRIORITY APPLICATION

This application claims priority to Korean Patent Application No. 2004-54489, filed Jul. 13, 2004, the disclosure of which is hereby incorporated herein by reference.

FIELD OF THE INVENTION

The present invention relates to an integrated circuit memory device, and more particularly, to bitline driving circuits and bitline driving methods.

BACKGROUND OF THE INVENTION

FIG. 1 illustrates a general integrated circuit memory device 100, which includes a cell array 110, an X-decoder 120, a Y-decoder and data output unit 130, and a controller 140. The controller 140, which controls the cell array 110, the X decoder 120, and the Y-decoder and data output unit 130, supports write and read operations to and from the cell array 110. As known to those skilled in the art, the X decoder 120 performs row addressing to select a wordline included in the cell array 110 upon data writing or reading. Upon data writing or reading, the Y-decoder and data output unit 130 performs column addressing to select a bitline included in the cell array 110 and senses and amplifies read-out data DOUT.

As shown in FIG. 2, the cell array 110 includes a plurality of rows and columns of memory cells 111 and a plurality of bitline driving circuits 120 driving differential bitlines BL/BLB connected to the memory cells 111. An operation of the bitline driving circuit 120 will now be described with reference to a timing diagram of FIG. 3. The bitline driving circuit 120 includes a first sense amplification circuit 112, which includes N-channel metal oxide semiconductor field effect transistors (MOSFETs) MN0 and MN1, a second sense amplification circuit 113, which includes P-channel MOSFETs MP0 and MP1, an N-channel pull-down MOSFET 114, which provides a ground voltage VSS during an operation of the first sense amplification circuit 112, a P-channel pull-up MOSFET 115, which provides a voltage VCCA during an operation of the second sense amplification circuit 113, a first precharge circuit 116 for left cells, and a second precharge circuit 117 for right cells. A discrete memory cell 210 included in the memory cells 111 stores data received via an input/output (IO) line (not shown) into a capacitor upon writing or outputs data stored in the capacitor to the IO line during reading. A single memory cell can be selected by selecting a wordline $WL_0/WL_1/\ldots/WL_{n-2}/WL_{n-1}$ in response to row addressing and selecting a pair of bitlines BL and BLB in response to column addressing.

Upon reading/writing, the first and second precharge circuits 116 and 117 precharge the bitlines BL and BLB with a voltage precharge VBL in response to a pair of signals PEQL and PISOL and a pair of signals PEQR and PISOR, respectively. These signals represent equalization and isolation signals. Accordingly, as shown in FIG. 3, if a wordline $WL_{n-1}$ is selected and activated to thereby cause a charge sharing between the memory cell 210 and the bitline BL/BLB, the first and second sense amplification circuits 112 and 113 receive the voltages VSS and VCCA from the MOFSETs 114 and 115, respectively, and sense and amplify voltages existing on the bitlines BL and BLB. At this time, when a column selection signal of a selected bitline is activated, the sense amplified signal is output to an IO line (not shown), and IO data transmitted to the IO line is sense amplified by an IO sense amplifier (not shown) once more and output to a data output (DQ) pad.

As semiconductor manufacturing and design techniques are advanced, a chip size of an integrated circuit memory device typically decreases, and a speed thereof typically increases. However, when transistors within the integrated circuit memory device are small, and a low voltage driving technique is adopted, leakage current or noise must be reduced and stable data sensing by a sense amplification circuit must be maintained.

In a general precharge and sense amplification scheme, a voltage VCCA/2 is used as the precharge voltage VBL. In the bitline pair BL/BLB receiving cell data from the memory cell 210, a level change of ΔVBL occurs as illustrated in Equation 1, before sense amplification. Sense amplification circuits 112 and 113 sense and amplify a voltage difference of ΔVBL between the bitlines BL and BLB and output a rail-to-rail voltage difference of VCCA. Equation 1 is:

$$\Delta VBL = (V\text{ cell} - VBL)/(1 + Cs/Cb) \quad (1)$$

wherein Vcell denotes a voltage level stored in the memory cell 210, VBL denotes a precharge level (e.g., VCCA/2), Cs denotes a capacitance of a capacitor included in the memory cell 210, and Cb denotes a bitline (BL/BLB) parasitic capacitance.

However, in the present condition where an operating voltage of an integrated circuit memory device is reduced, there is a sensitivity limit in lowering threshold voltages of MOSFETs MP0, MP1, MN0, and MN1 in the sense amplification circuits 112 and 113. Below these limits, the sense amplification circuits may fail. It is also difficult to render a precharge voltage greater or smaller than the voltage VCCA/2 to increase gate-source voltages Vgs applied to the MOSFETs MP0, MP1, MN0, and MN1.

To make sense amplification circuits sense data with greater stability, the threshold voltages between N-channel MOSFETs MN0 and MN1 included in the first sense amplifier 111 must be consistent, and the threshold voltages between P-channel MOSFETs MP0 and MP1 included in the second sense amplifier 113 must also be consistent. A mismatch between threshold voltages of transistors may generate errors when data is sensed and amplified and re-stored upon periodic data refresh in an integrated circuit memory device. These errors may limit the performance of the integrated circuit memory device. Moreover, if a difference between the voltages on bitlines BL and BLB is smaller than an amount of mismatch (hereinafter, referred to as an offset) between threshold voltages of the N-channel MOSFETs MN0 and MN1 (after charge sharing by the memory cell 210) and the bitline BL or BLB, the sense amplification circuits may fail in normal data sensing and limit the reliability of data refresh operations.

SUMMARY OF THE INVENTION

Embodiments of the present invention include an integrated circuit memory device having a pair of differential bit lines and a differential bit line driving circuit electrically coupled to the pair of differential bit lines. The differential bit line driving circuit includes a dummy memory cell therein, which is configured to selectively adjust a voltage of a first one of the pair of differential bit lines in response to a first reference word line signal and selectively adjust a voltage of a second one of the pair of differential bit lines in response to a second reference word line signal. A sense amplification circuit is also provided. This sense amplification circuit is electrically coupled to the pair of differential bit lines during a sense amplification time interval. An auxiliary circuit is provided, which is electrically coupled to a pull-up or pull-down node in the sense amplification circuit. The auxiliary circuit is configured to reduce a voltage difference between the pair of differential bit lines at a tail end of the sense amplification time interval by changing a voltage of the pull-up or pull-down node. In some of these embodiments, the sense amplification circuit includes a pair of PMOS transistors electrically coupled to the pull-up node. In this case, the auxiliary circuit is configured to reduce a voltage of the pull-up node at the tail end of the sense amplification time interval. In alternative embodiments, the sense amplification circuit includes a pair of NMOS transistors electrically coupled to the pull-down node. In this case, the auxiliary circuit is configured to increase a voltage of the pull-down node at the tail end of the sense amplification time interval.

According to additional embodiments of the invention, an integrated circuit memory device includes a pair of differential bit lines and a memory cell electrically coupled to the pair of differential bit lines. A sense amplification circuit is electrically coupled to the pair of differential bit lines during a sense amplification time interval. An auxiliary circuit is also provided. The auxiliary circuit is electrically coupled to a pull-up or pull-down node in the first sense amplification circuit. The auxiliary circuit is configured to reduce a voltage difference between the pair of differential bit lines at a tail end of the sense amplification time interval by changing a voltage of the pull-up or pull-down node. In some of these embodiments, the sense amplification circuit includes a pair of PMOS transistors electrically coupled to the pull-up node. In this case, the auxiliary circuit is configured to reduce a voltage of the pull-up node at the tail end of the sense amplification time interval. In alternative embodiments, the sense amplification circuit includes a pair of NMOS transistors electrically coupled to the pull-down node. In this case, the auxiliary circuit is configured to increase a voltage of the pull-down node at the tail end of the sense amplification time interval.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
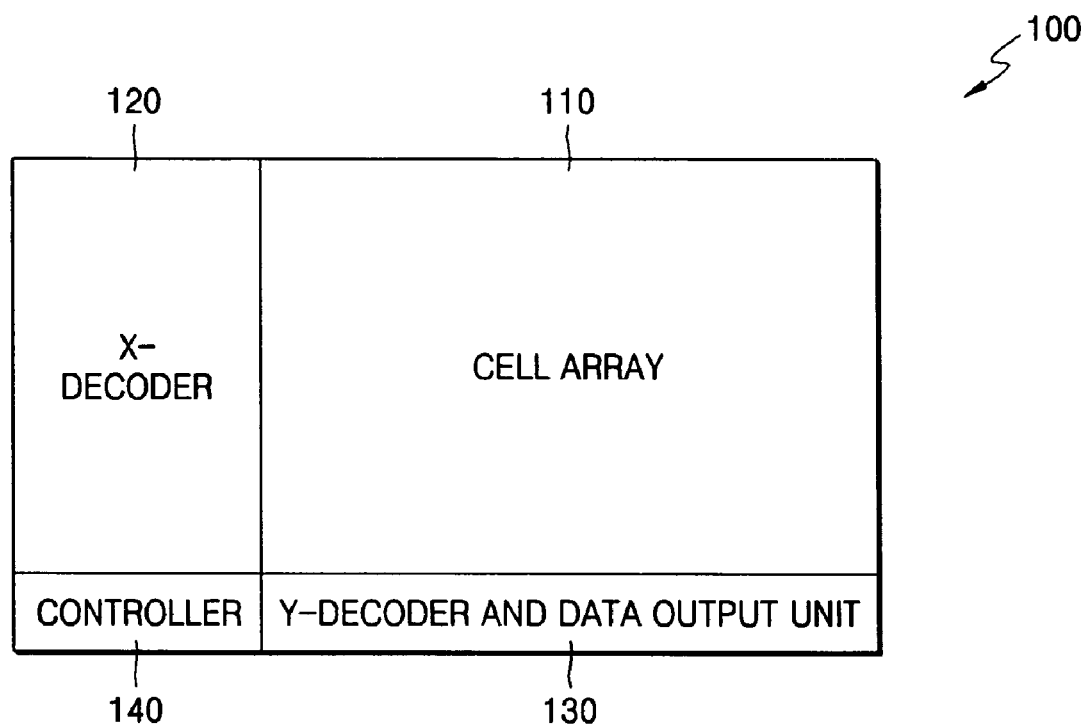
FIG. 1 illustrates a block diagram of a conventional integrated circuit memory device.
Figure 2:
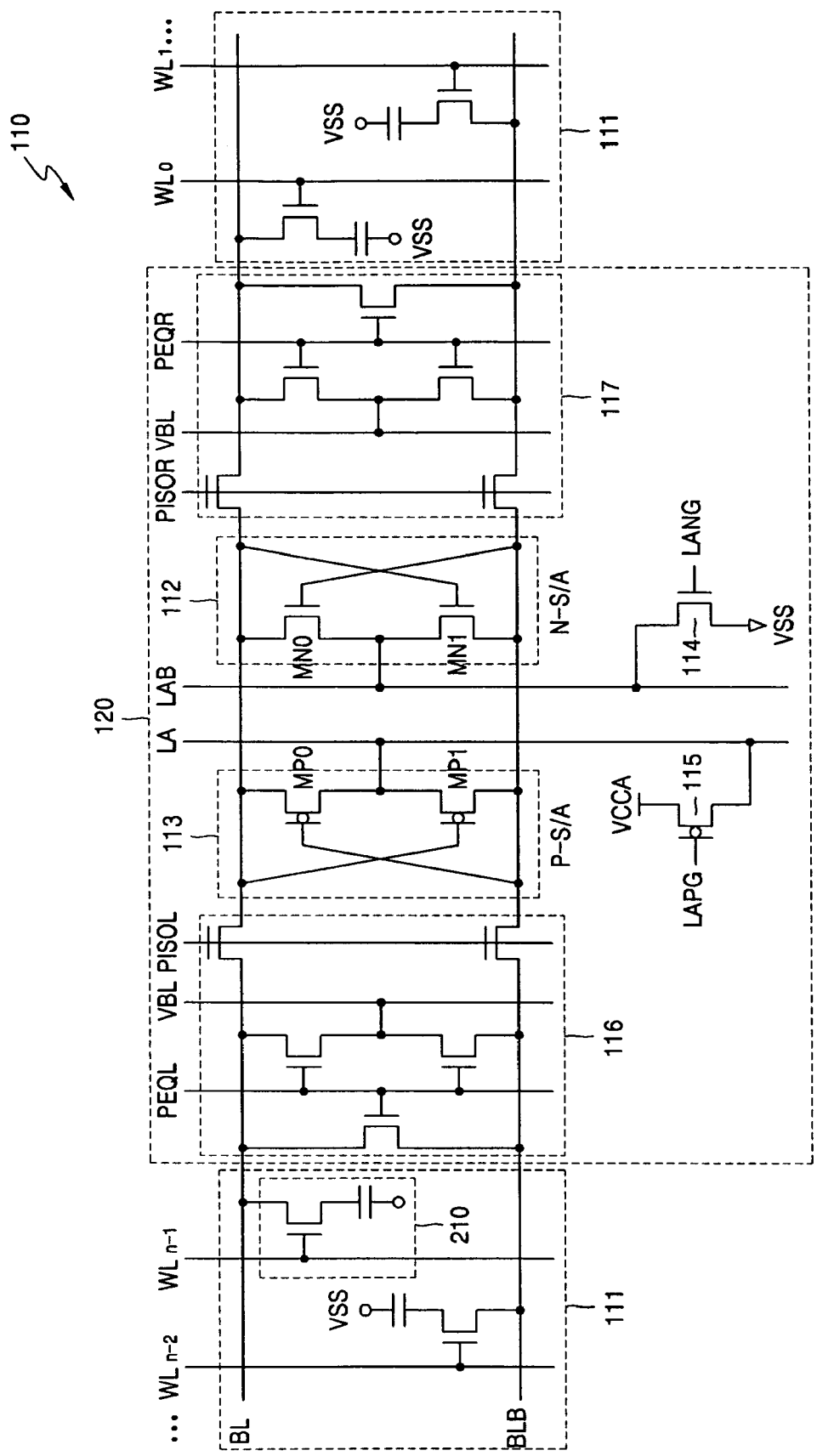
FIG. 2 is an electrical schematic of a bit line driving circuit that may be included in the memory device of FIG. 1.
Figure 3:
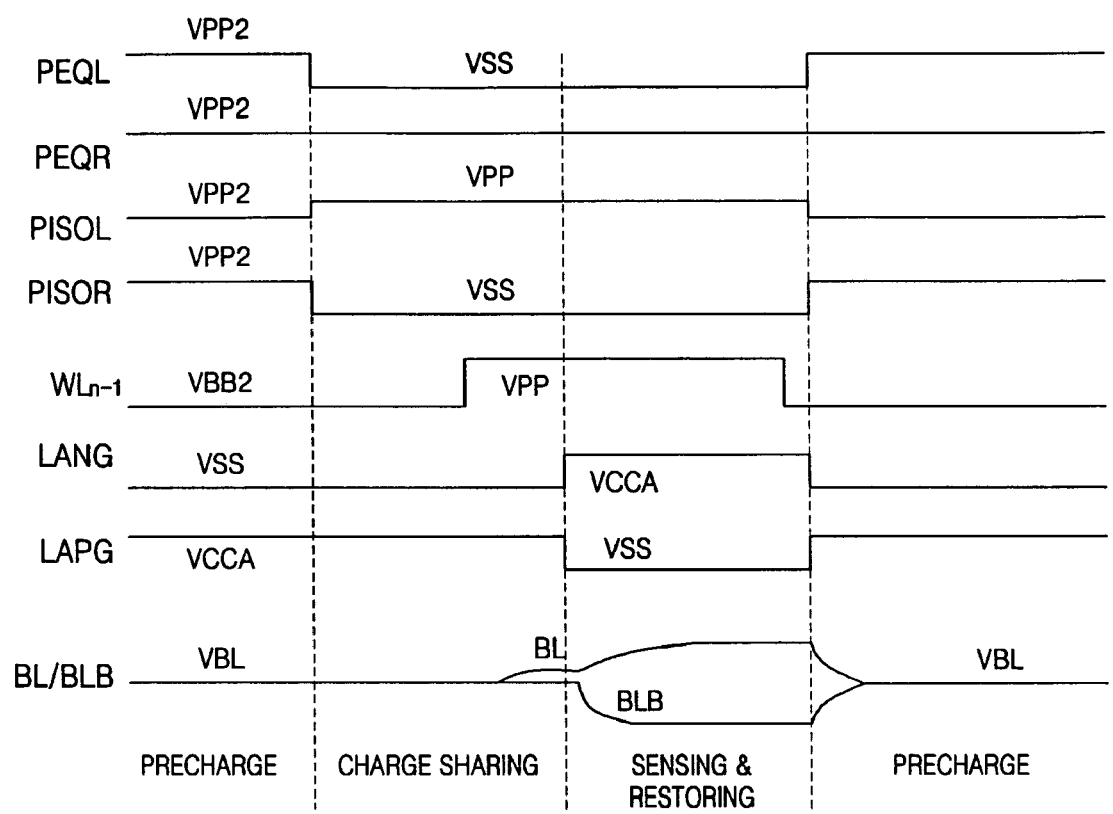
FIG. 3 is a timing diagram that illustrates operation of the bit line driving circuit of FIG. 2.
Figure 4:
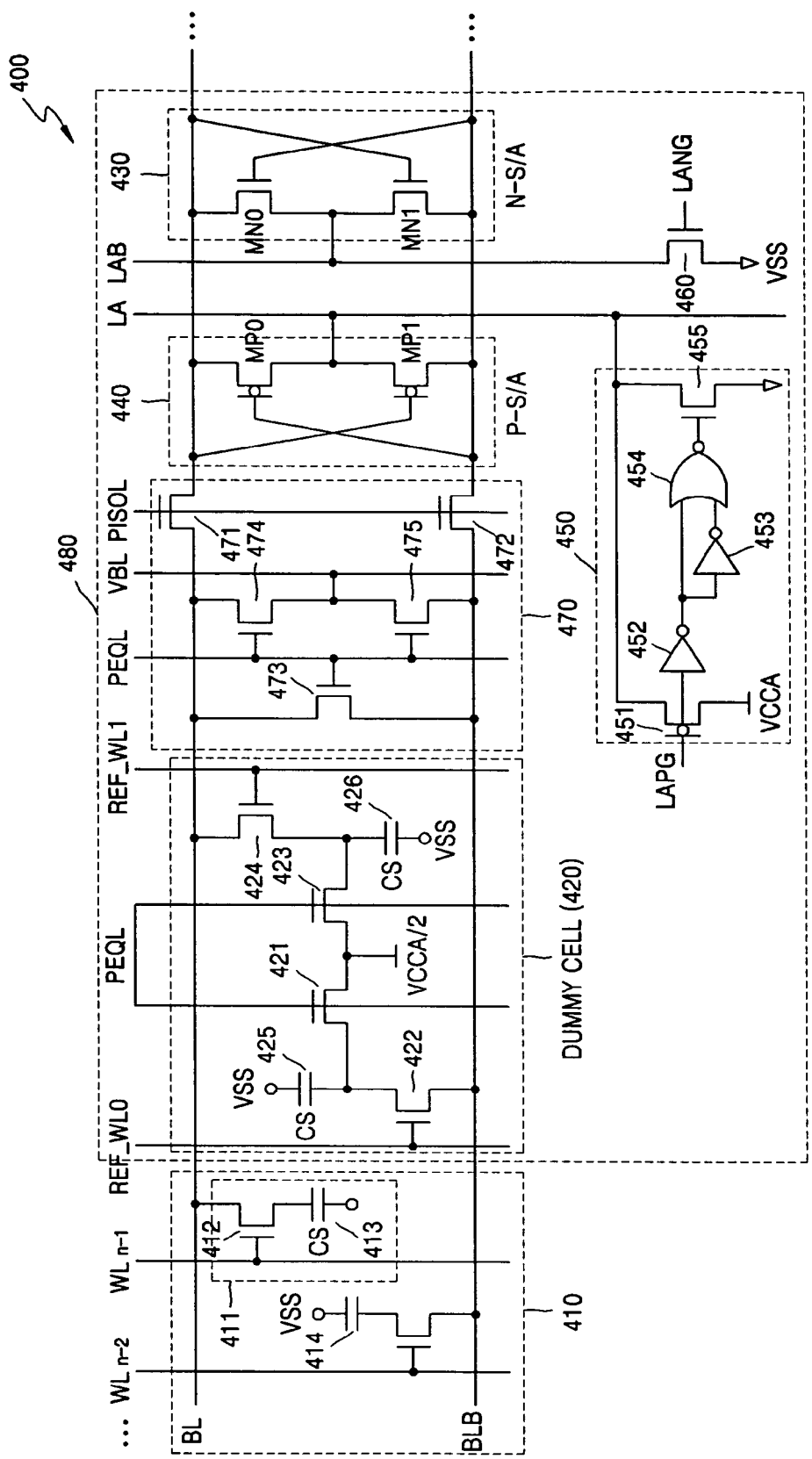
FIG. 4 is an electrical schematic of a portion of an integrated circuit memory device, which includes a bit line driving circuit and memory cells according to embodiments of the present invention.
Figure 5:
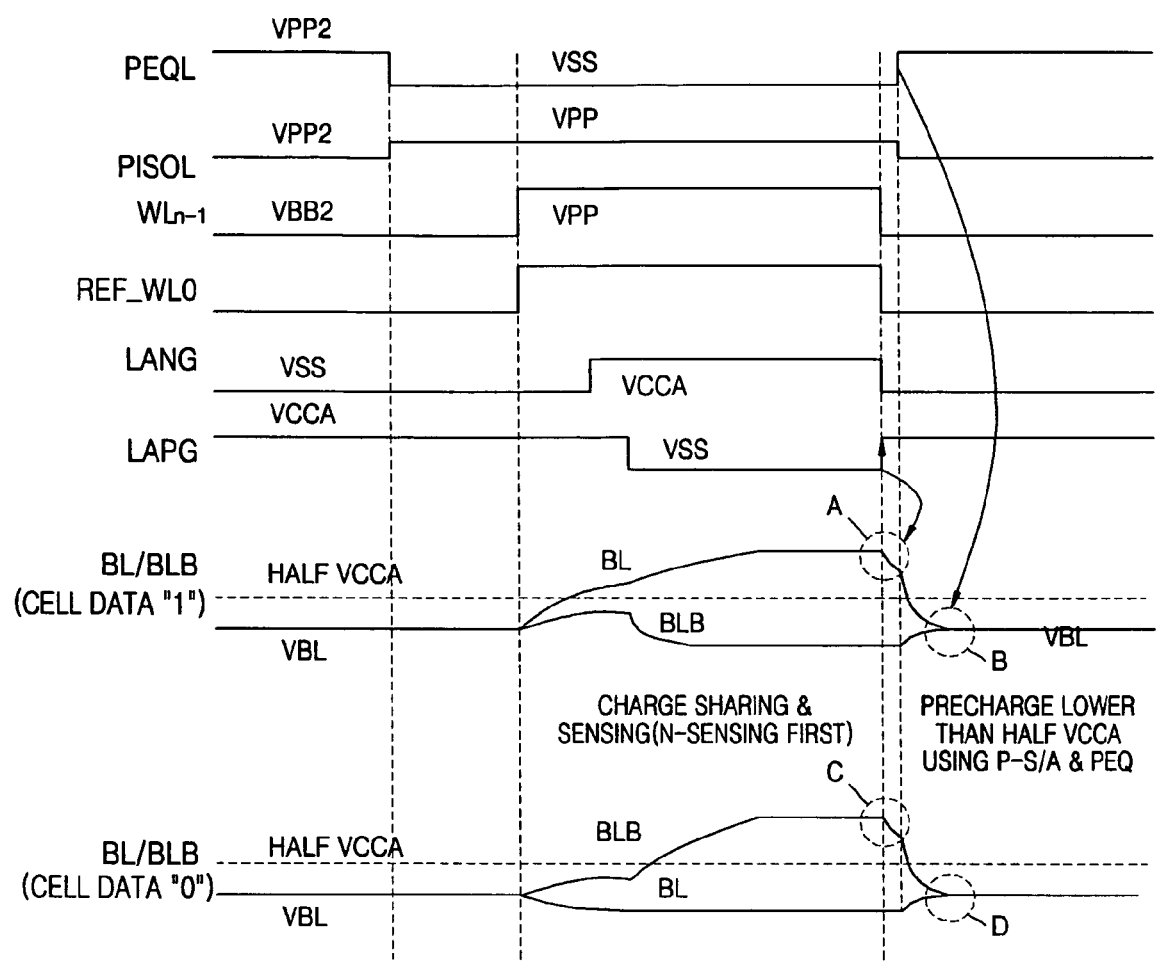
FIG. 5 is a timing diagram that illustrates operation of the bit line driving circuit of FIG. 4.

FIG. 4 is a circuit diagram of memory cells 410 and a bitline driving circuit 480 that are included in a cell array 400 according to an embodiment of the present invention. Although the cell array 400 includes a plurality of bitline pairs, memory cells connected to the bitline pairs, and bitline driving circuits, FIG. 4 illustrates only a memory cell 410, which is connected to a single pair of bitlines BL and BLB, and the corresponding bitline driving circuit 480. A single cell 411 includes a MOSFET 412 and a storage capacitor 413. The memory cell 410 includes a plurality of cells 411. As shown in FIG. 4, cells included in the memory cell 410 can be connected to first and second bitlines BL and BLB in such a way that one cell is connected to the first bitline BL and an adjacent cell is connected to the second bitline BLB. The first bitline BL is treated herein as a true bitline, and the second bitline BLB is treated herein as a complementary bitline BLB. The bitline driving circuit 480 includes a dummy cell 420, first and second sense amplification circuits 430 and 440, an auxiliary circuit 450, and a bitline precharge circuit 470. The bitline driving circuit 480 further includes a pull-down MOSFET 460 for transferring a first power supply voltage VSS to a line LAB. An operation of the bitline driving circuit 480 of FIG. 4 will now be described with reference to a timing diagram of FIG. 5. In FIGS. 5, 7, 9, and 11, the references VBL, VPP, VPP2, VBB2, VCCA, and VSS denote voltages of different levels for driving corresponding lines.

In FIG. 4, the dummy cell 420 includes MOSFETs 421 and 422 and a first dummy capacitor 425, which are used to share charge with the second bitline BLB. The dummy cell 420 also includes MOSFETs 423 and 424 and a second dummy capacitor 426, which are used to share charge with the first bitline BL. The dummy cell 420 contributes to stable charge sharing to the bitlines BL and BLB before sense amplification is performed by the sense amplification circuits 430 and 440 when reading data from a memory cell.

In particular, the dummy cell 420 can be utilized to supply additional charge to the second bit line BLB when the reference word line REF_WL0 is enabled or supply additional charge to the first bit line BL when the reference word line REF_WL1 is enabled. Accordingly, as illustrated by the timing diagram of FIG. 5, reading data from the cell 411 onto the first bit line BL in response to driving the word line WLn-1 to a logic 1 level, will cause a charge transfer between the storage capacitor 413 and the first bit line BL. This charge transfer will be a forward transfer of charge from the storage capacitor 413 to the first bit line BL in the event the cell data equals "1" or a reverse transfer of charge from the first bit line BL to the storage capacitor 413 in the event the cell data equals "0". In both of these cases, additional charge will also be transferred from the first dummy capacitor 425 to the second bit line BLB upon a logic 1 transition of the reference word line REF_WL0. Alternatively, reading data from the cell containing storage capacitor 414 onto the second bit line BLB in response to driving the word line WLn-2 to a logic 1 level, will cause a charge transfer between the storage capacitor 414 and the second bit line BLB. This charge transfer will be a forward transfer of charge from the storage capacitor 414 to the second bit line BLB in the event the cell data equals "1" or a reverse transfer of charge from the second bit line BLB to the storage capacitor 414 in the event the cell data equals "0". In both of these cases, additional charge will also be transferred from the second dummy capacitor 426 to the first bit line BL upon a logic 1 transition of the reference word line REF_WL1. More specifically, when a cell connected to the first bitline BL is selected from cells included in the memory cell 410, the dummy cell 420 makes the first dummy capacitor 425 connected to the second bitline BLB via the MOSFET 422 share charge with a cell capacitor (for example, the capacitor 413) connected to the first bitline BL when the reference word line REF_WL0 is enabled. Also, the dummy cell 420 makes the second dummy capacitor 426 connected to the first bitline BL via the MOSFET 424 share charge with a cell capacitor (for example, the capacitor 414) connected to the second bitline BLB when the reference word line REF_WL1 is enabled. For example, in FIG. 5, when a signal PEQL is activated, the first and second dummy capacitors 425 and 426 have previously been charged with voltage VCCA/2. In this condition, when a wordline $WL_{n-1}$ is selected, a cell connected to the first bitline BL is selected, and the first dummy capacitor 425 and the cell capacitor 414 connected to the first bitline BL share charge according to the enabled reference word line REF_WL0. Hence, the bitlines BL and BLB stably share charge. A capacitance CS of the dummy capacitors 425 and 426 is equal to that of each cell capacitor included in the memory cell 410.

In FIG. 4, the first sense amplification circuit 430 which includes N-channel MOSFETs MN0 and MN1, senses and amplifies a difference between voltages of the first and second bitlines BL and BLB using the first power supply voltage VSS, after the charge sharing between the memory cell 410 and the dummy cell 420. The amplification of the difference between the voltages of the bitlines BL and BLB becomes faster and more accurate by an interaction of the first sense amplification circuit 430 with the second sense amplification circuit 440. The second sense amplification circuit 440, which includes P-channel MOSFETs MP0 and MP1, senses and amplifies the difference between the voltages of the first and second bitlines BL and BLB using a second power supply voltage VCCA, after the charge sharing between the memory cell 410 and the dummy cell 420. The first power supply voltage VSS is input to the first sense amplification circuit 430 via the line LAB in response to a signal LANG. The second power supply voltage VCCA is input to the second sense amplification circuit 440 via a line LA in response to a signal LAPG.

The precharge circuit 470, which includes a plurality of MOSFETs 471 through 475, short-circuits and precharges the first and second bitlines BL and BLB using a third power supply voltage VBL after sense amplification is performed by the first and second sense amplification circuits 430 and 440. The first and second bitlines BL and BLB are short-circuited to each other in response to a signal PEQL, and the first and second bitlines BL and BLB are cut off and separated from sense amplification circuits in response to a signal PISOL.

Since it may be difficult that the bitlines BL and BLB are precharged with a level smaller than or greater than a voltage VCCA/2 between the first and second power supply voltages VSS and VCCA by only the precharge circuit 470, the cell array 400 of FIG. 4 proposes a scheme of precharging the bitlines BL and BLB with a voltage smaller than the voltage VCCA/2 using the auxiliary circuit 450. In FIG. 4, the auxiliary circuit 450 includes a P-channel MOSFET 451, an N-channel MOSFET 455, first and second inverters 452 and 453, and a NOR logic 454. The auxiliary circuit 450 provides the second power supply voltage VCCA in response to the signal LAPG to enable the second sense amplification circuit 440 to perform sense amplification and change a voltage level on the first or second bitline BL or BLB to a new level before the precharging by the precharge circuit 470, as indicated by circles A and C of FIG. 5. For example, if voltages of the bitlines BL and BLB are amplified to the first and second power supply voltages VSS and VCCA, respectively, or vice versa after the sense amplifications by the sense amplification circuits 430 and 440, and the signal LAPG becomes logic high before the precharging by the precharge circuit 470, a voltage of the line LA is made smaller than the second power supply voltage VCCA by the auxiliary circuit 450. At this time, a bitline having the second power supply voltage VCCA moves toward an intermediate level between the first and second power supply voltages VSS and VCCA. If memory cell data is a "1", a voltage of the first bitline BL is amplified to the second power supply voltage VCCA by the sense amplification circuits 430 and 440. Accordingly, when the line LA is instantaneously rendered smaller than the second power supply voltage VCCA by the auxiliary circuit 450, the second power supply voltage of the first bitline BL decreases toward the intermediate level between the first and second power supply voltages VSS and VCCA as indicated by circle A of FIG. 5. Similarly, if the memory cell data is a "0", a voltage of the second bitline BLB is amplified to the second power supply voltage VCCA by the sense amplification circuits 430 and 440. Accordingly, when the line LA is instantaneously rendered smaller than the second power supply voltage VCCA by the auxiliary circuit 450, the second power supply voltage of the second bitline BLB decreases toward the intermediate level VCCA/2 between the first and second power supply voltages VSS and VCCA as indicated by circle "C" of FIG. 5.

In other words, a bitline having a higher voltage among the bitlines BL and BLB undergoes a voltage decrease by an operation of the auxiliary circuit 450. Hence, when the signal PEQL becomes logic high, the bitlines BL and BLB are precharged to have voltages smaller than the intermediate level VCCA/2 between the first and second power supply voltages VSS and VCCA as indicated by circles B and D of FIG. 5. By precharging the bitlines BL and BLB to have voltages smaller than the voltage VCCA/2 using the auxiliary circuit 450, a gate-source voltage Vgs of the transistors MP0 and MP1, which constitute the second sense amplification circuit 440, is increased. Accordingly, a sensing margin for a lower voltage (e.g., voltage VSS) of voltages of the bitlines BL and BLB can be enhanced.

Figure 6:
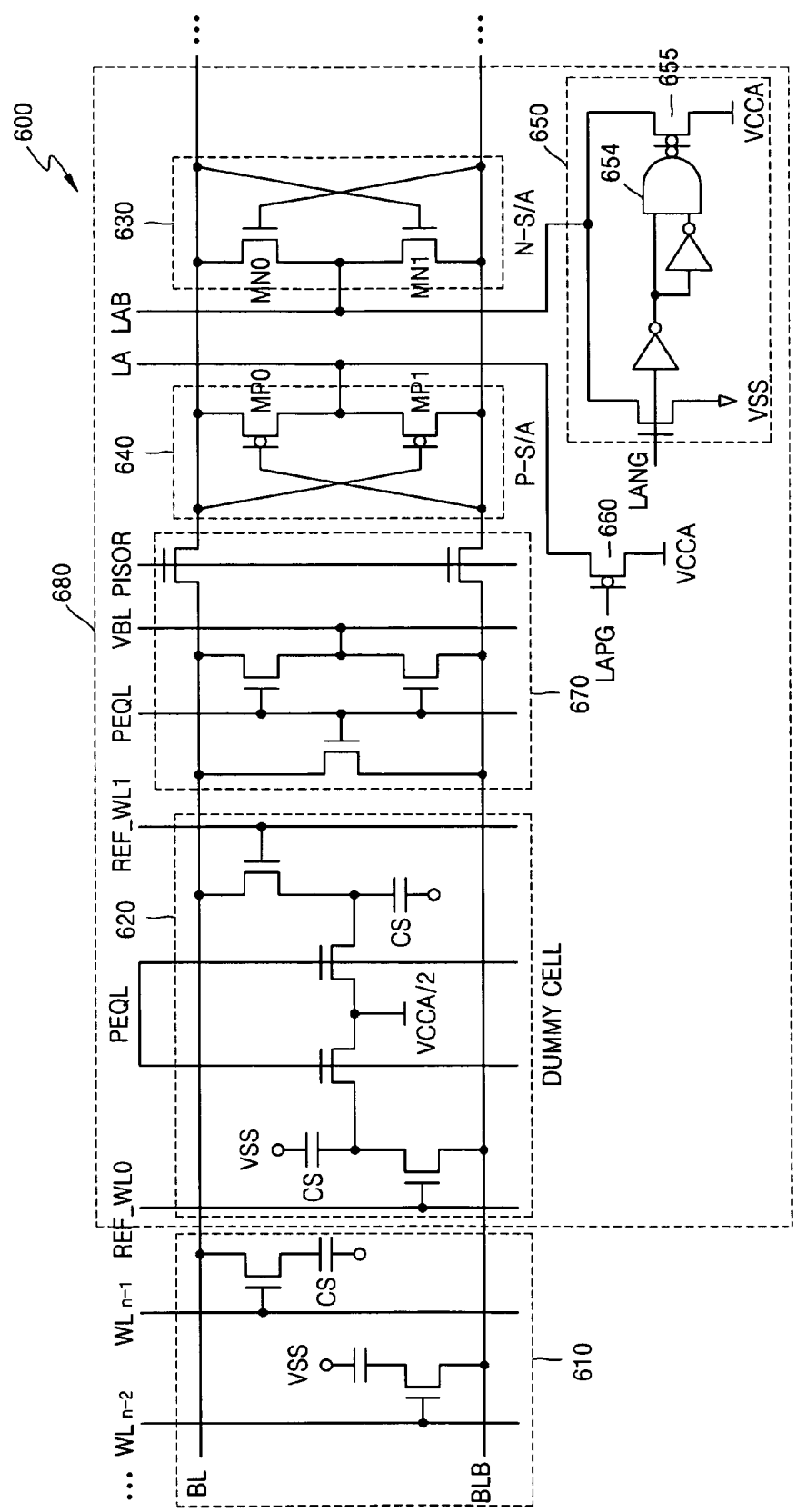
FIG. 6 is an electrical schematic of a portion of an integrated circuit memory device which includes a bit line driving circuit and memory cells according to embodiments of the present invention.
Figure 7:
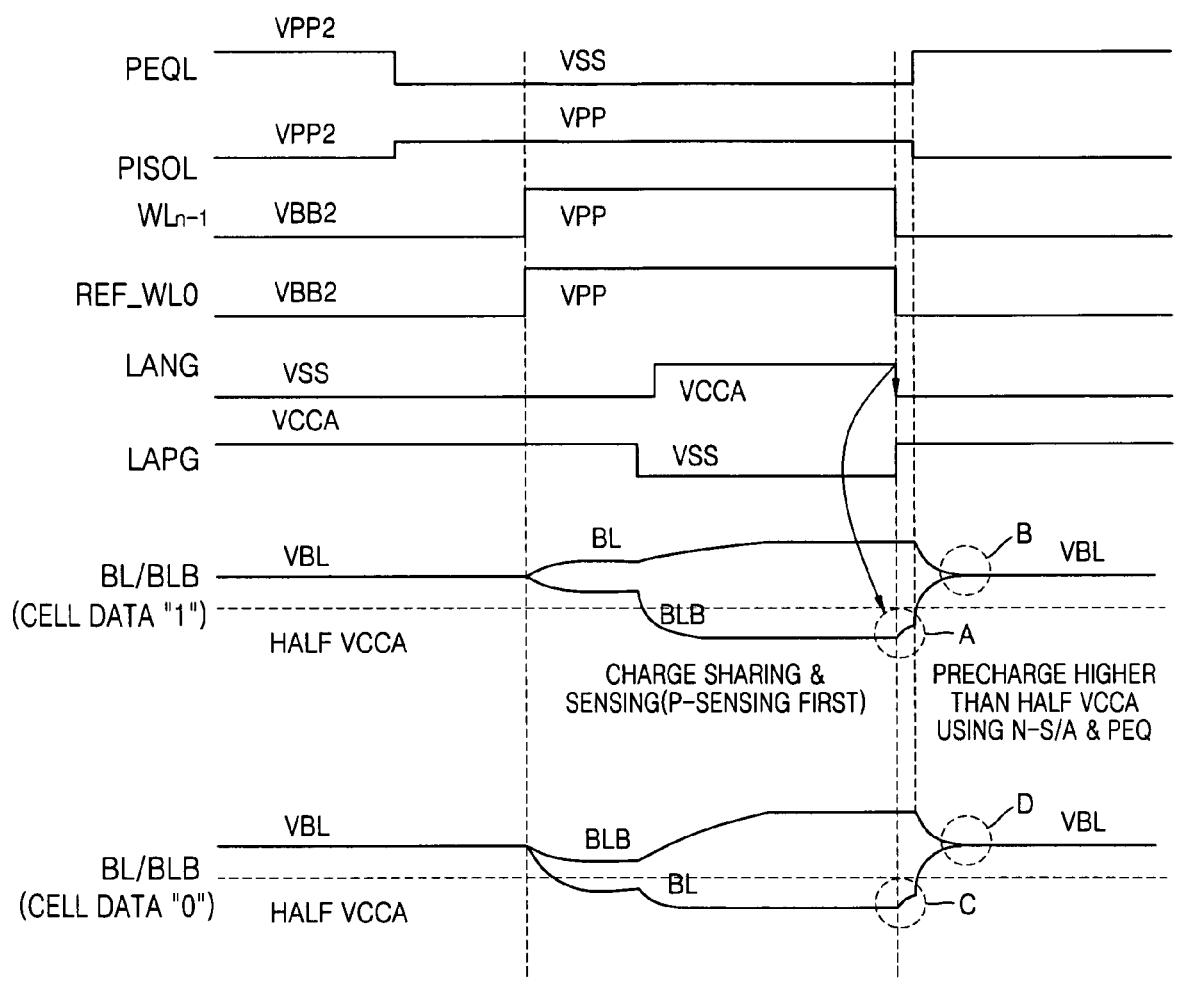
FIG. 7 is a timing diagram that illustrates operation of the bit line driving circuit of FIG. 6.

FIG. 6 is a circuit diagram of a memory cell 610 and a bitline driving circuit 680, which are included in a cell array 600 according to another embodiment of the present invention. FIG. 7 is a timing diagram for illustrating operations of control signals for operating the bitline driving circuit 680 and operations of bitlines BL and BLB according to the control signals. Referring to FIG. 6, similar to FIG. 4, the memory cell 610 includes a plurality of cells that store data "1" or "0", and the bitline driving circuit 680 includes a dummy cell 620, first and second sense amplification circuits 630 and 640, an auxiliary circuit 650, and a precharge circuit 670. The bitline driving circuit 680 further includes a MOSFET 660 for transmitting the second power supply voltage VCCA to a line LA. Many of the components of FIG. 6 and their operations are the same as those of FIG. 4, so they will not be described herein. While the auxiliary circuit 450 of FIG. 4 includes the NOR logic 454 and the N-channel MOSFET 455, the auxiliary circuit 650 of FIG. 6 includes a NAND logic 654 and a P-channel MOSFET 655. In the embodiment of FIG. 6, a scheme is provided in which the auxiliary circuit 650 precharges the bitlines BL and BLB with a voltage greater than the voltage VCCA/2 by controlling the first power supply voltage VSS, which is input to the first sense amplification circuit 630, to be input to the line LAB is proposed.

In FIG. 6, the auxiliary circuit 650 provides the first power supply voltage VSS in response to the signal LANG to enable the first sense amplification circuit 630 to perform sense amplification and particularly, changes a voltage level kept in the first or second bitline BL or BLB by the sense amplifications performed by the sense amplification circuits 630 and 640 to a new level before precharging by the precharge circuit 670, as indicated by A and C of FIG. 7. For example, if voltages of the bitlines BL and BLB are amplified to the first and second power supply voltage VSS and VCCA, respectively, or vice versa after the sense amplifications by the sense amplification circuits 630 and 640, and the signal LANG becomes logic low before the precharging by the precharge circuit 670, a voltage of the line LAB is instantaneously made smaller than the first power supply voltage VSS by the auxiliary circuit 650. At this time, a bitline having the first power supply voltage of the bitlines BL and BLB by an operation of the first sense amplification circuit 630 varies toward the intermediate level between the first and second power supply voltages VSS and VCCA. If memory cell data is 1, a voltage of the second bitline BLB is amplified to the first power supply voltage VSS by the sense amplifications performed by the sense amplification circuits 630 and 640. Accordingly, when the line LAB is instantaneously rendered greater than the first power supply voltage VSS by the auxiliary circuit 650, the first power supply voltage VSS of the second bitline BLB is increased to the intermediate level between the first and second power supply voltages VSS and VCCA as indicated by A of FIG. 7. Similarly, if the memory cell data is 0, a voltage of the first bitline BL is amplified to the first power supply voltage VSS by the sense amplifications performed by the sense amplification circuits 630 and 640. Accordingly, when the line LAB is instantaneously rendered greater than the first power supply voltage VSS by the auxiliary circuit 650, the first power supply voltage VSS of the first bitline BL increases toward the intermediate level VCCA/2 between the first and second power supply voltages VSS and VCCA as indicated by C of FIG. 7.

In other words, a bitline having a lower voltage among the bitlines BL and BLB undergoes a voltage increase by an operation of the auxiliary circuit 650. Hence, when the signal PEQL becomes logic high, the bitlines BL and BLB are precharged to have voltages greater than the intermediate level VCCA/2 between the first and second power supply voltages VSS and VCCA as indicated by B and D of FIG. 7. As described above, by precharging the bitlines BL and BLB to have voltages greater than the voltage VCCA/2 using the auxiliary circuit 650, a gate-source voltage Vgs of transistors MN0 and MN1, which constitute the first sense amplification circuit 630, is increased. Accordingly, a sensing margin for a higher voltage (e.g., voltage VCCA) of voltages of the bitlines BL and BLB can be enhanced.

Figure 8:
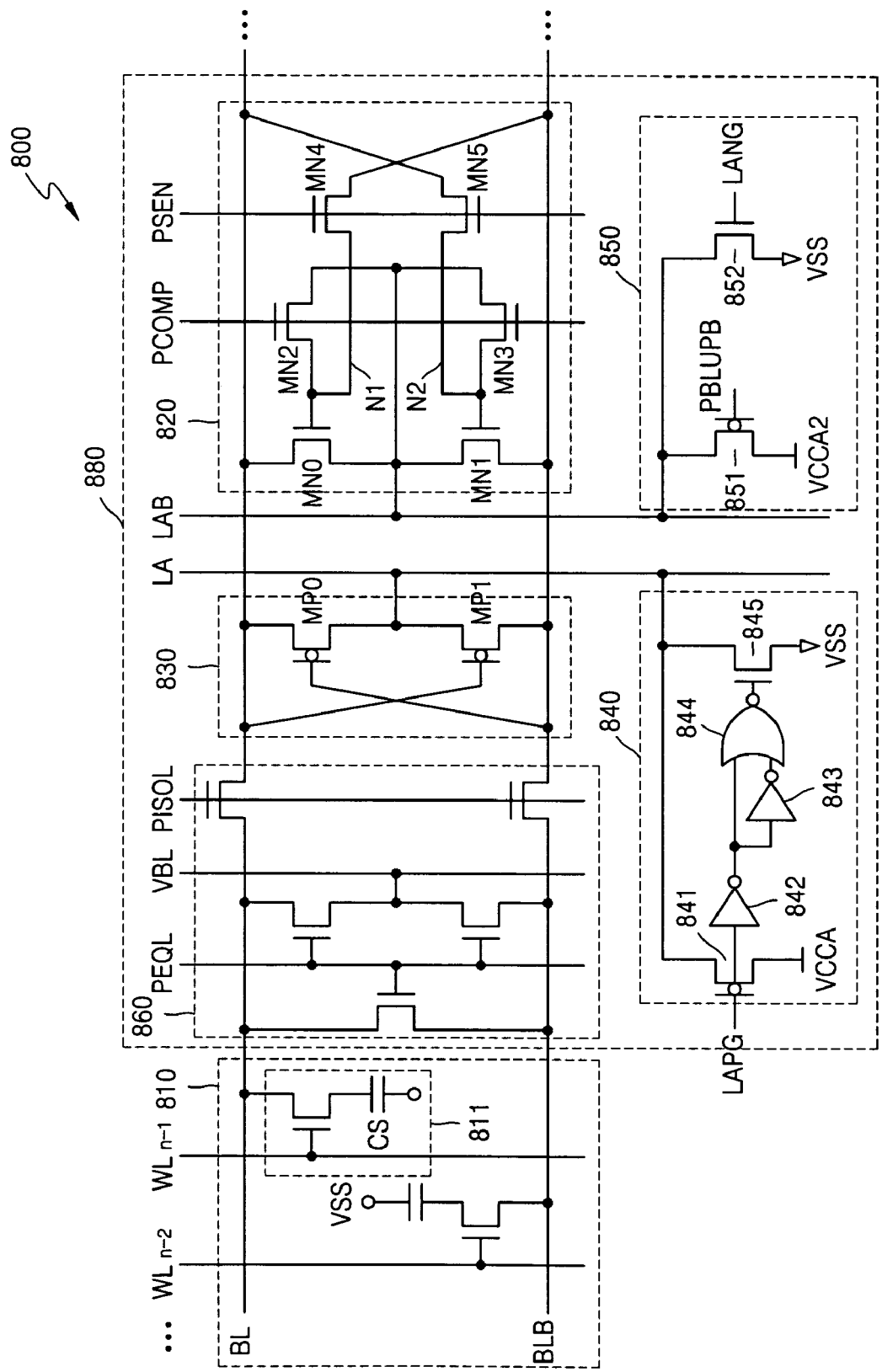
FIG. 8 is an electrical schematic of a portion of an integrated circuit memory device, which includes a bit line driving circuit and memory cells according to embodiments of the present invention.

FIG. 8 is a circuit diagram of memory cells 810 and bitline driving circuits 880, which are included in a cell array 800 according to still another embodiment of the present invention. Similar to FIG. 4 or 6, the cell array 800 includes a plurality of pairs of bitlines BL and BLB, a plurality of memory cells 810 connected to the bitline pairs, and a plurality of bitline driving circuits 880. However, FIG. 8 illustrates a single memory cell 810 and a single bitline driving circuit 880, which are connected to a pair of bitlines BL and BLB. The memory cell 810 includes a plurality of cells 811, each of which is comprised of a single MOSFET and a single capacitor. The bitline driving circuit 880 includes first and second sense amplification circuits 820 and 830, an auxiliary circuit 840, an offset control circuit 850, and a precharge and equalization circuit 860. For convenience's sake, similar to FIGS. 4 and 6, FIG. 8 does not illustrate IO lines and an IO sense amplifier for sensing and amplifying IO data transmitted to the IO lines. An operation of the bitline driving circuit 880 will now be described with reference to FIG. 9. Since operations of the second sense amplification circuit 830, the auxiliary circuit 840, and the precharge circuit 860 are the same as those of the second sense amplification circuit 440, the auxiliary circuit 450, and the precharge circuit 470, they will not be described further herein. Operations of the first sense amplification circuit 820, the auxiliary circuit 840, and the offset control circuit 850 will now be described.

In the embodiment of FIG. 8, a scheme of precharging the bitlines BL and BLB with a voltage smaller than the voltage VCCA/2 using the auxiliary circuit 840, which is a counterpart of the auxiliary circuit 450 of FIG. 4, is used. Also, a scheme of compensating for a threshold voltage offset between N-channel MOFSETs MN0 and MN1 constituting the first sense amplification circuit 820 is proposed. Since the scheme of precharging the bitlines BL and BLB with the voltage smaller than the voltage VCCA/2 using the auxiliary circuit 840 can be referred to FIG. 4, only the scheme of compensating for the threshold voltage offset between the N-channel MOFSETs MN0 and MN1 of the first sense amplification circuit 820 will now be described. A compensation for a threshold voltage offset between P-channel MOFSETs MP0 and MP1 of the second sense amplification circuit 830 by the bitline driving circuit 880 will be described later with reference to FIG. 10.

The first sense amplification circuit 820 includes first through sixth MOSFETs MN0 through MN5. The first MOSFET MN0 has a gate electrode connected to a first node N1, one of source and drain electrodes connected to the first bitline BL, and the other receiving a fourth power supply voltage VCCA2. The second MOSFET MN1 has a gate electrode connected to a second node N2, one of source and drain electrodes connected to the second bitline BLB, and the other receiving the fourth power supply voltage VCCA2. The third MOSFET MN2 has a gate electrode receiving a first control signal PCOMP, one of source and drain electrodes connected to the first node N1, and the other receiving the fourth power supply voltage VCCA2. The fourth MOSFET MN3 has a gate electrode receiving the first control signal PCOMP, one of source and drain electrodes connected to the second node N2, and the other receiving the fourth power supply voltage VCCA2. The fifth MOSFET MN4 has a gate electrode receiving a second control signal PSEN, one of source and drain electrodes connected to the first node N1, and the other connected to the second bitline BLB. The sixth MOSFET MN5 has a gate electrode receiving the second control signal PSEN, one of source and drain electrodes connected to the second node N2, and the other connected to the first bitline BL.

Figure 9:
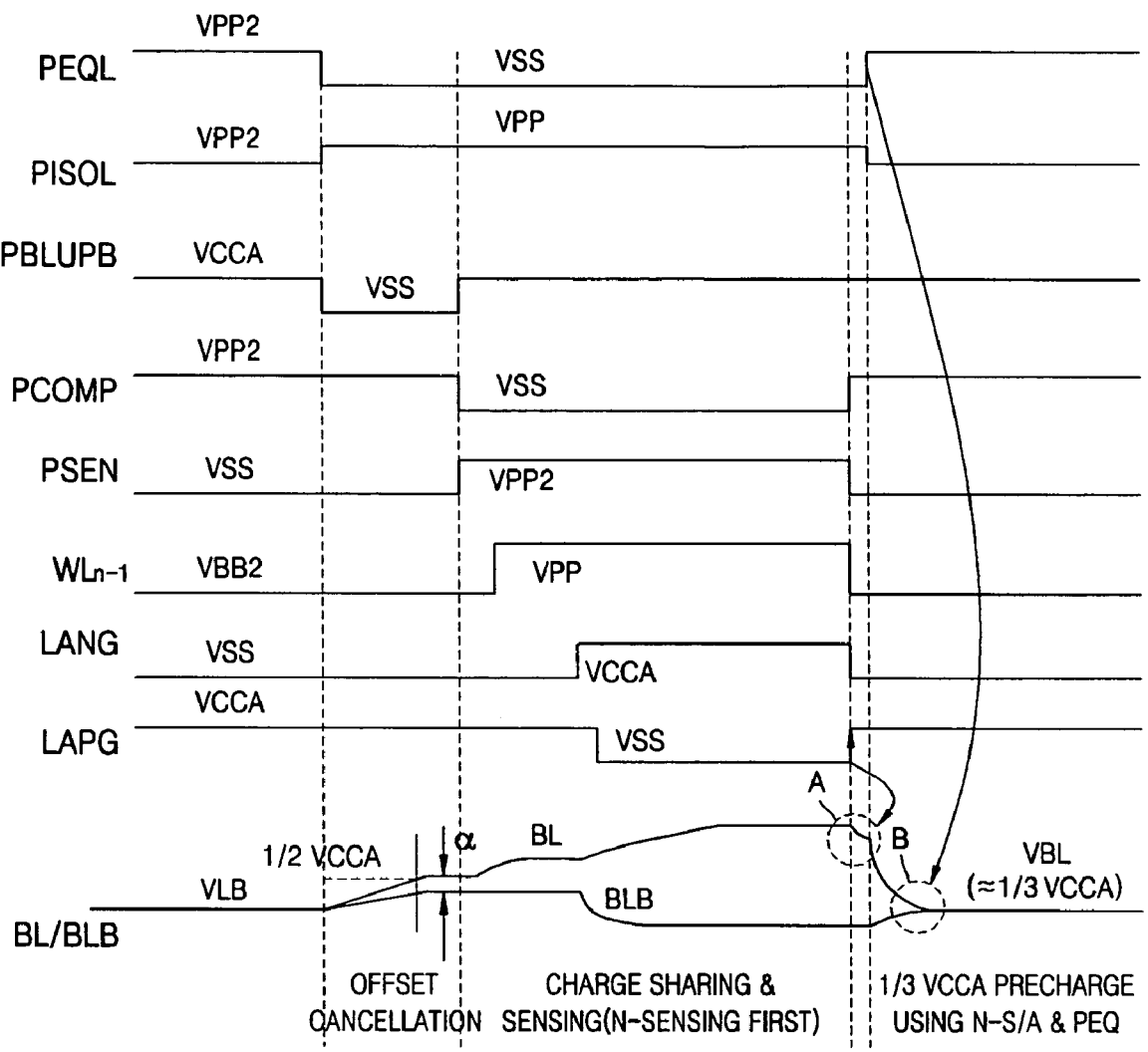
FIG. 9 is a timing diagram that illustrates operation of the bit line driving circuit of FIG. 8.

Referring to FIG. 9, the first sense amplification circuit 820 removes a threshold voltage offset α between the first and second MOSFETs MN0 and MN1 before a wordline (for example, wordline $WL_{n-1}$) is selected and activated to logic high. Upon the offset removal, a signal PBLUPB is logic low, the signal PCOMP is logic high, and the signal PSEN is logic low. Upon the offset removal, the third and fourth MOSFETs MN2 and MN3 perform diode operations, and accordingly, voltages $VCCA2-V_{t,MN0}$ and $VCCA2-V_{t,MN1}$ appear in the first and second bitlines BL and BLB, respectively. $V_{t,MN0}$ and $V_{t,MN1}$ denote threshold voltages of the first and second MOSFETs MN0 and MN1, respectively. When the signal PBLUPB goes to logic high, the signal PCOMP goes to logic low, and the signal PSEN goes to logic high after the offset removal and before the activation of the wordline (for example, wordline $WL_{n-1}$), gate-source voltages between the first and second MOSFETs MN0 and MN1 become equal. Hence, when the wordline (for example, wordline $WL_{n-1}$) is activated, charge is shared by the first or second bitline BL or BLB and a capacitor of a memory cell (e.g., the memory cell 811). At this time, while the signal LANG is going to logic high, the first sense amplification circuit 820 performs sense amplification. The first sense amplification circuit 820 senses and amplifies a voltage difference generated between the first and second bitlines BL and BLB by charge sharing, using the first power supply voltage VSS. The amplification of the voltage difference between the first and second bitlines BL and BLB is made faster and more accurate by an interaction between the first and second amplification circuits 820 and 830. As described above with reference to FIG. 4, the second sense amplification circuit 830 senses and amplifies the voltage difference between the first and second bitlines BL and BLB after the charge sharing using the second power supply voltage VCCA. The first power supply voltage VSS is input to the first sense amplification circuit 820 via the line LAB in response to the signal LANG, and the second power supply voltage VCCA is input to the second sense amplification circuit 830 via the line LA in response to the signal LAPG.

As described above with reference to FIG. 4, the precharge circuit 860 short-circuits and precharges the first and second bitlines BL and BLB using a third power supply voltage VBL after the sense amplifications performed by the first and second sense amplification circuits 820 and 830. The first and second bitlines BL and BLB are cut-off and separated from each other in response to the signal PEQL, and the first and second bitlines are cut off and separated from sense amplification circuits in response to the signal PISOL. As shown in FIG. 9, the third power supply voltage VBL is preferably VCCA/3.

The fourth power supply voltage VCCA2 uses a voltage slightly greater than a sum of the voltage VCCA/2 and a threshold voltage $V_{t1}$ of each of the MOSFETs MN0 and MN1 as in Equation 2:

$$VCCA2 = VCCA/2 + V_{t1} + V_{\alpha1} \quad (2)$$

wherein $V_{\alpha1}$ is preferably several tens of mV.

Hence, upon the offset removal, the voltages of the bitlines BL and BLB may become higher than the voltage VCCA/2. The increase of the voltages of the bitlines BL and BLB leads to a decrease in the voltage difference between the first and second bitlines BL and BLB upon charge sharing by a memory cell and a bitline. The decrease in the voltage difference impedes stable sense amplification. The auxiliary circuit 840 is used to prevent the stable sense amplification from being impeded. In other words, similar to FIG. 4, the auxiliary circuit 840 provides the second power supply voltage VCCA in response to the signal LAPG to enable the second sense amplification circuit 830 to perform sense amplification and particularly, changes a voltage level kept in the first or second bitline BL or BLB by the sense amplifications performed by the sense amplification circuits 820 and 830 to a new level before the precharging by the precharge circuit 860, as indicated by A and B of FIG. 9. For example, if voltages of the bitlines BL and BLB are amplified to the first and second power supply voltages VSS and VCCA, respectively, or vice versa after the sense amplifications by the sense amplification circuits 820 and 830, and the signal LAPG becomes logic high before the precharging by the precharge circuit 860, a voltage of the line LA is instantaneously made smaller than the second power supply voltage VCCA by the auxiliary circuit 840. At this time, a bitline having the second power supply voltage VCCA of the bitlines BL and BLB by an operation of the second sense amplification circuit 830 varies toward an intermediate level between the first and second power supply voltages VSS and VCCA.

Accordingly, in the embodiment of FIG. 8, a sensing margin for a lower voltage (e.g., voltage VSS) of voltages of the bitlines BL and BLB can be enhanced using the auxiliary circuit 840, and a threshold voltage offset between the bitlines BL and BLB is removed in the first sense amplification circuit 820. Thus, stable sense amplification is possible.

Figure 10:
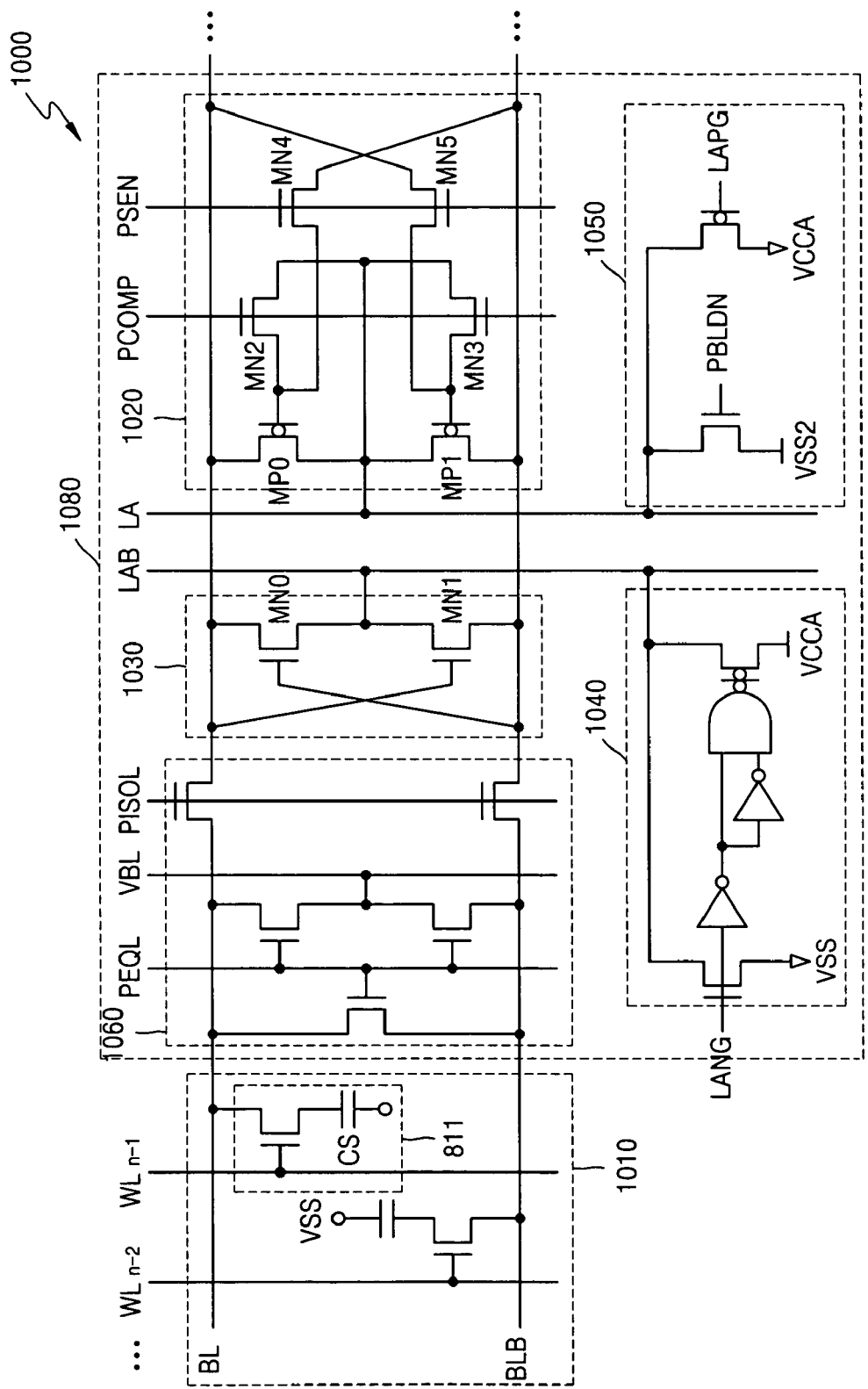
FIG. 10 is an electrical schematic of a portion of an integrated circuit memory device, which includes a bit line driving circuit and memory cells according to embodiments of the present invention.
Figure 11:
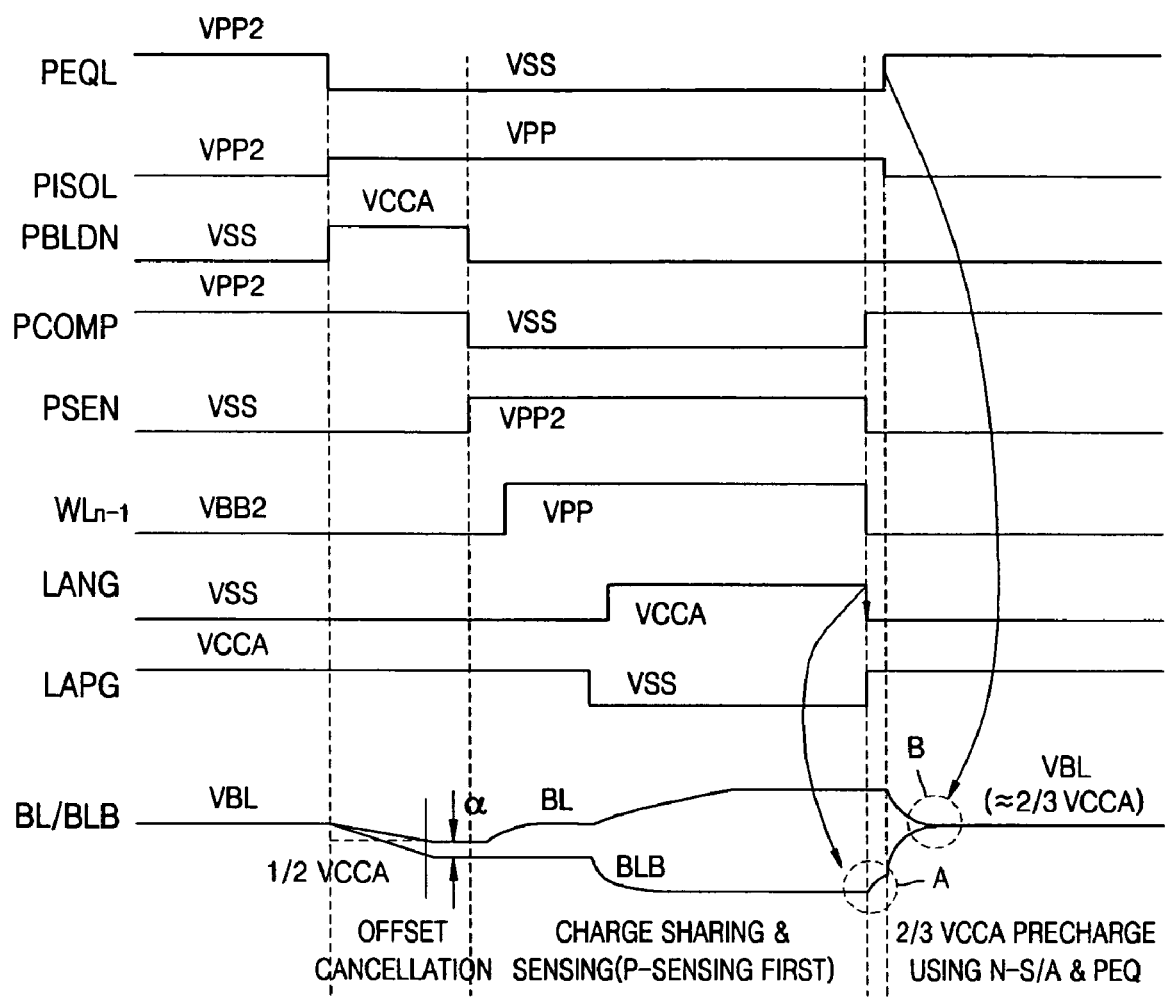
FIG. 11 is a timing diagram that illustrates operation of the bit line driving circuit of FIG. 10.

FIG. 10 is a circuit diagram of memory cells 1010 and bitline driving circuits 1080, which are included in a cell array 1000 according to yet another embodiment of the present invention. FIG. 11 is a timing diagram for illustrating operations of control signals for operating the bitline driving circuits 1080 and operations of bitlines BL and BLB according to the control signals. Referring to FIG. 10, similar to FIG. 8, each of the memory cells 1010 includes a plurality of cells that store data "1" or "0", and each of the bitline driving circuits 1080 includes first and second sense amplification circuits 1020 and 1030, an auxiliary circuit 1040, an offset control circuit 1050, and a precharge circuit 1060. Most of components of FIG. 10 and their operations are the same as those of FIG. 8, so they will not be described herein.

Operations of the first sense amplification circuit 1020, the auxiliary circuit 1040, and the offset control circuit 1050 will now be described while being compared with the operations of the first sense amplification circuit 820, the auxiliary circuit 840, and the offset control circuit 850. In the embodiment of FIG. 10, a scheme of precharging the bitlines BL and BLB with a voltage greater than the voltage VCCA/2 by controlling an input of a first power supply voltage VSS, which is input to the second sense amplification circuit 1030, to the line LAB using the auxiliary circuit 1040 is used. A scheme of compensating for a threshold voltage offset between P-channel MOFSETs MP0 and MP1 constituting the first sense amplification circuit 1020 is also proposed.

Referring to FIG. 10, the first sense amplification circuit 1020 removes a threshold voltage offset α between the first and second MOSFETs MP0 and MP1 before a wordline (for example, wordline $W_{n-1}$) is selected and activated to logic high. Upon the offset removal, a signal PBLDN is logic high, the signal PCOMP is logic high, and the signal PSEN is logic low. Upon the offset removal, MOSFETs MN2 and MN3 perform diode operations, and accordingly, voltages VCCA2-$V_{t,MP0}$ and VCCA2-$V_{t,MP1}$ appear in the first and second bitlines BL and BLB, respectively. $V_{t,MP0}$ and $V_{t,MP1}$ denote threshold voltages of the first and second MOSFETs MP0 and MP1, respectively. When the signal PBLDN goes to logic low, the signal PCOMP goes to logic low, and the signal PSEN goes to logic high after the offset removal and before the activation of the wordline (for example, wordline $WL_{n-1}$), gate-source voltages between the MOSFETs MP0 and MP1 become equal. Hence, when the wordline (for example, wordline $WL_{n-1}$) is activated, charge is shared by the first or second bitline BL or BLB and a capacitor of a memory cell (e.g., the memory cell 811). At this time, while the signal LAPG is going to logic low, the first sense amplification circuit 1020 performs sense amplification. The first sense amplification circuit 1020 senses and amplifies a voltage difference generated between the first and second bitlines BL and BLB by charge sharing, using the second power supply voltage VCCA.

The precharge circuit 1060 short-circuits and precharges the first and second bitlines BL and BLB using a third power supply voltage VBL after the sense amplifications performed by the first and second sense amplification circuits 1020 and 1030. As shown in FIG. 11, the third power supply voltage VBL is preferably ⅔ VCCA.

A fourth power supply voltage VSS2 is a voltage slightly smaller than a sum of the voltage VCCA/2 and a threshold voltage $V_{t2}$ of each of the MOSFETs MP0 and MP1 as in Equation 3:

$$VSS2 = VCCA/2 - V_{t2} - V_{\alpha 2} \quad (3)$$

wherein $V_{\alpha 2}$ is preferably several tens of mV.

Hence, upon the offset removal, the voltages of the bitlines BL and BLB may become smaller than the voltage VCCA/2. The decrease of the voltages of the bitlines BL and BLB leads to a decrease in the voltage difference between the first and second bitlines BL and BLB upon charge sharing by a memory cell and a bitline. The decrease in the voltage difference impedes stable sense amplification. The auxiliary circuit 1040 is used to prevent the stable sense amplification from being impeded. In other words, similar to FIG. 6, the auxiliary circuit 1040 provides the first power supply voltage VSS in response to the signal LANG to enable the second sense amplification circuit 1030 to perform sense amplification and particularly, changes a voltage level kept in the first or second bitline BL or BLB by the sense amplifications performed by the sense amplification circuits 1020 and 1030 to a new level before the precharging by the precharge circuit 1060, as indicated by A and B of FIG. 11. For example, if voltages of the bitlines BL and BLB are amplified to the first and second power supply voltages VSS and VCCA, respectively, or vice versa after the sense amplifications by the sense amplification circuits 1020 and 1030, and the signal LANG becomes logic low before the precharging by the precharge circuit 1060, a voltage of the line LAB is instantaneously made greater than the first power supply voltage VSS by the auxiliary circuit 1040. At this time, a bitline having the first power supply voltage VSS of the bitlines BL and BLB by an operation of the second sense amplification circuit 1030 is increased from the first power supply voltage VSS to an intermediate level between the first and second power supply voltages VSS and VCCA.

Accordingly, in the embodiment of FIG. 11, a sensing margin for a higher voltage (e.g., voltage VCCA) of voltages of the bitlines BL and BLB can be enhanced using the auxiliary circuit 1040, and a threshold voltage offset between the bitlines BL and BLB is removed in the first sense amplification circuit 1020. Thus, stable sense amplification is possible.

In the bitline driving circuits 480, 680, 880, and 1080, a new scheme of precharging the bitlines BL and BLB to have voltages greater than or smaller than the voltage VCCA/2 using the auxiliary circuits 450 and 650 is used to increase the gate-source voltage Vgs of transistors included in each sense amplification circuit. Also, the dummy cells 420 and 620 can maintain the voltage difference ΔVBL between the bitlines BL and BLB generated after charge sharing when cell data is 1 or 0. Furthermore, the first sense amplification circuits 820 and 1020, which are controlled by the offset control circuits 850 and 1050, can remove a threshold voltage offset between the transistors. At this time, the auxiliary circuits 840 and 1040 are used to stabilize the voltage difference ΔVBL.

As described above, an integrated circuit memory according to the present invention can increase the gate-source voltage Vgs of transistors included in each sense amplifier, maintain voltage difference ΔVBL between the bitlines BL and BLB generated after charge sharing, and remove a threshold voltage offset between the transistors. Thus, refresh characteristics can be stably enhanced even under process variations or low-voltage operation conditions.

Accordingly, as described above, embodiments of the present invention include an integrated circuit memory device having a pair of differential bit lines (e.g., BL and BLB) and a differential bit line driving circuit electrically coupled to the pair of differential bit lines. The differential bit line driving circuit includes a dummy memory cell (e.g., 420, 620) therein. This dummy memory cell is configured to selectively adjust a voltage of a first one of the pair of differential bit lines in response to a first reference word line signal (e.g., REF_WL0) and selectively adjust a voltage of a second one of the pair of differential bit lines in response to a second reference word line signal (e.g., REF_WL1). A sense amplification circuit (e.g., 440, 640) is also provided. This sense amplification circuit is electrically coupled to the pair of differential bit lines during a sense amplification time interval. An auxiliary circuit (e.g., 450, 650) is provided, which is electrically coupled to a pull-up or pull-down node (e.g., node between PMOS transistors MP0, MP1 in FIG. 4 or node between NMOS transistors MN0, MN1 in FIG. 6) in the sense amplification circuit. The auxiliary circuit is configured to reduce a voltage difference between the pair of differential bit lines at a tail end of the sense amplification time interval by changing a voltage of the pull-up or pull-down node. In some of these embodiments, the sense amplification circuit includes a pair of PMOS transistors (e.g., MP0, MP1) electrically coupled to the pull-up node. In this case, the auxiliary circuit is configured to reduce a voltage of the pull-up node at the tail end of the sense amplification time interval. In alternative embodiments, the sense amplification circuit includes a pair of NMOS transistors (e.g., MN0, MN1) electrically coupled to the pull-down node. In this case, the auxiliary circuit is configured to increase a voltage of the pull-down node at the tail end of the sense amplification time interval.

According to additional embodiments of the invention, an integrated circuit memory device includes a pair of differential bit lines and a memory cell electrically coupled to the pair of differential bit lines. A sense amplification circuit (e.g., 440, 640, 830 or 1030) is electrically coupled to the pair of differential bit lines during a sense amplification time interval. An auxiliary circuit (e.g., 450, 650, 840 or 1040) is also provided. The auxiliary circuit is electrically coupled to a pull-up or pull-down node in the first sense amplification circuit. The auxiliary circuit is configured to reduce a voltage difference between the pair of differential bit lines at a tail end of the sense amplification time interval by changing a voltage of the pull-up or pull-down node. In some of these embodiments, the sense amplification circuit includes a pair of PMOS transistors electrically coupled to the pull-up node. In this case, the auxiliary circuit is configured to reduce a voltage of the pull-up node at the tail end of the sense amplification time interval. In alternative embodiments, the sense amplification circuit includes a pair of NMOS transistors electrically coupled to the pull-down node. In this case, the auxiliary circuit is configured to increase a voltage of the pull-down node at the tail end of the sense amplification time interval.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit memory device, comprising:
    a pair of differential bit lines;
    a memory cell electrically coupled to said pair of differential bit lines;
    a sense amplification circuit electrically coupled to said pair of differential bit lines during a sense amplification time interval; and
    an auxiliary circuit electrically coupled to a pull-down node in said sense amplification circuit, said auxiliary circuit configured to reduce a voltage difference between said pair of differential bit lines by increasing a voltage of the pull-down node at a tail end of the sense amplification time interval.

2. The device of claim 1, wherein said sense amplification circuit comprises a pair of NMOS transistors electrically coupled to the pull-down node.

3. A bitline driving circuit of an integrated circuit memory, comprising:
    a dummy cell including a first dummy capacitor and a second dummy capacitor, the first dummy capacitor sharing charge with a memory cell capacitor connected to a first bitline in response to a first reference signal and the second dummy capacitor sharing charge with a memory cell capacitor connected to a second bitline in response to a second reference signal;
    a first sense amplification circuit sensing and amplifying a voltage difference between the first and second bitlines generated by the charge sharing, using a first power supply voltage;
    a second sense amplification circuit sensing and amplifying the voltage difference between the first and second bitlines generated by the charge sharing, using a second power supply voltage;
    a precharge circuit short-circuiting and precharging the first and second bitlines using a third power supply voltage after the sense amplifications performed by the first and second sense amplification circuits; and
    an auxiliary circuit changing a voltage level kept in the first or second bitline by the sense amplifications to a new level before the precharging;
    wherein the auxiliary circuit changes the voltage level kept in the first or second bitline to an intermediate level between the first and second power supply voltages; and
    wherein the precharge circuit precharges the first and second bitlines to a voltage level greater than the intermediate level between the first and second power supply voltages.

4. The bitline driving circuit of claim 3, wherein the auxiliary circuit changes the first power supply voltage to the intermediate level between the first and second power supply voltages before the precharging.

5. The bitline driving circuit of claim 4, wherein the first sense amplification circuit increases the first power supply voltage of the second bitline to the intermediate level between the first and second power supply voltages before the precharging when the memory cell data is 1, and increases the first power supply voltage of the first bitline to the intermediate level between the first and second power supply voltages before the precharging when the memory cell data is 0.

6. The bitline driving circuit of claim 4, wherein the first and second dummy capacitors are the same as the memory cell capacitor.

7. The bitline driving circuit of claim 6, wherein one of the first and second dummy capacitors of the dummy cell connected to a bitline other than a bitline connected to a memory cell capacitor shares charge with the memory cell capacitor.

8. A bitline driving circuit of an integrated circuit memory, comprising:
    a pair of differential bitlines;
    a memory cell electrically coupled to said pair of differential bitlines;
    a first sense amplification circuit configured to change a voltage of a first bitline of the pair of bitlines to a voltage obtained by subtracting a threshold voltage of a first MOSFET from a fourth power supply voltage and to change a voltage of a second bitline of the pair of differential bitlines to a voltage obtained by subtracting a threshold voltage of a second MOSFET from the fourth power supply voltage, and further configured to sense and amplify using a first power supply voltage a voltage difference between the first and second bitlines generated by charge sharing between one of the first and second bitlines and a memory cell capacitor;
    a second sense amplification circuit sensing and amplifying the voltage difference between the first and second bitlines generated by the charge sharing, using a second power supply voltage;
    a precharge circuit short-circuiting and precharging the first and second bitlines using a third power supply voltage after the sense amplifications performed by the first and second sense amplification circuits; and an auxiliary circuit changing a voltage level kept in the first or second bitline by the sense amplifications to a new level before the precharging.

9. The bitline driving circuit of claim 8, wherein the first sense amplification circuit comprises:
the first MOSFET having a gate electrode connected to a first node, one of source and drain electrodes connected to the first bitline, and the other receiving the fourth power supply voltage;
the second MOSFET having a gate electrode connected to a second node, one of source and drain electrodes connected to the second bitline, and the other receiving the fourth power supply voltage;
a third MOSFET having a gate electrode receiving a first control signal, one of source and drain electrodes connected to the first node, and the other receiving the fourth power supply voltage;
a fourth MOSFET having a gate electrode receiving the first control signal, one of source and drain electrodes connected to the second node, and the other receiving the fourth power supply voltage;
a fifth MOSFET having a gate electrode receiving a second control signal, one of source and drain electrodes connected to the first node, and the other connected to the second bitline; and
a sixth MOSFET having a gate electrode receiving the second control signal, one of source and drain electrodes connected to the second node, and the other connected to the first bitline,
wherein the voltages of the first and second bitlines are changed to the voltages obtained by subtracting the threshold voltages of first and second MOSFETs from the fourth power supply voltage, respectively, in response to the first and second control signals, respectively.

10. The bitline driving circuit of claim 9, wherein:
the first and second MOSFETs of the first sense amplification circuit are of N-channel type;
the MOSFETs constituting the second sense amplification circuit are of P-channel type; and
the fourth power supply voltage is greater than the intermediate level between the first and second power supply voltages.

11. The bitline driving circuit of claim 10, wherein the precharge circuit precharges the first and second bitlines to a voltage level smaller than the intermediate level between the first and second power supply voltages.

12. The bitline driving circuit of claim 11, wherein the auxiliary circuit changes the second power supply voltage to the intermediate level between the first and second power supply voltages before the precharging.

13. The bitline driving circuit of claim 12, wherein the second sense amplification circuit drops the second power supply voltage of the first bitline to the intermediate level between the first and second power supply voltages before the precharging when the memory cell data is 1, and drops the second power supply voltage of the second bitline to the intermediate level between the first and second power supply voltages before the precharging when the memory cell data is 0.

14. The bitline driving circuit of claim 9, wherein:
the first and second MOSFETs of the first sense amplification circuit are of P-channel type;
the MOSFETs constituting the second sense amplification circuit are of N-channel type; and
the fourth power supply voltage is smaller than the first power supply voltage.

15. The bitline driving circuit of claim 14, wherein the precharge circuit precharges the first and second bitlines to a voltage level greater than the intermediate level between the first and second power supply voltages.

16. The bitline driving circuit of claim 15, wherein the auxiliary circuit changes the first power supply voltage to the intermediate level between the first and second power supply voltages before the precharging.

17. The bitline driving circuit of claim 16, wherein the first sense amplification circuit increases the first power supply voltage of the second bitline to the intermediate level between the first and second power supply voltages before the precharging when the memory cell data is 1, and increases the first power supply voltage of the first bitline to the intermediate level between the first and second power supply voltages before the precharging when the memory cell data is 0.

18. A method of driving bitlines of an integrated circuit memory, the method comprising:
making a first dummy capacitor share charge with a memory cell capacitor connected to a first bitline in response to a first reference signal and making a second dummy capacitor share charge with a memory cell capacitor connected to a second bitline in response to a second reference signal;
sensing and amplifying a voltage difference between the first and second bitlines generated by the charge sharing, using a first power supply voltage;
sensing and amplifying the voltage difference between the first and second bitlines generated by the charge sharing, using a second power supply voltage;
short-circuiting and precharging the first and second bitlines using a third power supply voltage after the sense amplifications performed by the first and second sense amplification circuits; and
changing a voltage level kept in the first or second bitline by the sense amplifications to a new level before the precharging;
wherein the new level is an intermediate level between the first and second power supply voltages; and
wherein in the precharging, the first and second bitlines are precharged to a voltage level greater than the intermediate level between the first and second power supply voltages.

19. The method of claim 18, wherein in the changing of the voltage level kept in the first or second bitline to the new level, the first power supply voltage is changed to the intermediate level between the first and second power supply voltages before the precharging.

20. The method of claim 19, wherein before the precharging, the first power supply voltage of the second bitline is increased to the intermediate level between the first and second power supply voltages when the memory cell data is 1, and the first power supply voltage of the first bitline is increased to the intermediate level between the first and second power supply voltages when the memory cell data is 0.

21. A method of driving bitlines of an integrated circuit memory, the method comprising:
changing voltages of the first and second bitlines to voltages obtained by subtracting threshold voltages of first and second MOSFETs from a fourth power supply voltage;
sensing and amplifying a voltage difference between the first and second bitlines generated by charge sharing between one of the first and second bitlines and a memory cell capacitor, using a first power supply voltage;

sensing and amplifying the voltage difference between the first and second bitlines generated by the charge sharing, using a second power supply voltage;

short-circuiting and precharging the first and second bitlines using a third power supply voltage after the sense amplifications performed by the first and second sense amplification circuits; and changing a voltage level kept in the first or second bitline by the sense amplifications to a new level before the precharging;

wherein in the precharging, the first and second bitlines are precharged to a voltage level greater than the intermediate level between the first and second power supply voltages.

22. The method of claim 21, wherein in the changing of the voltage level kept in the first or second bitline to the new level, the first power supply voltage is changed to the intermediate level between the first and second power supply voltages before the precharging.

23. The method of claim 22, wherein before the precharging, the first power supply voltage of the second bitline is increased to the intermediate level between the first and second power supply voltages when the memory cell data is 1, and the first power supply voltage of the first bitline is increased to the intermediate level between the first and second power supply voltages when the memory cell data is 0.

* * * * *